United States Patent
Hori (10) Patent No.: US 7,502,393 B2
(45) Date of Patent: Mar. 10, 2009

(54) LIGHT-EMITTING DEVICE HAVING RESONATOR AND LIGHT SOURCE UNIT INCLUDING THE LIGHT-EMITTING DEVICE

(75) Inventor: Yuichiro Hori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 87 days.

(21) Appl. No.: 11/275,023

(22) Filed: Dec. 2, 2005

(65) Prior Publication Data

US 2006/0120414 A1    Jun. 8, 2006

(30) Foreign Application Priority Data

Dec. 2, 2004    (JP)    ............... 2004-349663

(51) Int. Cl.
*H01S 3/10*    (2006.01)
(52) U.S. Cl. .......................... 372/22; 372/21
(58) Field of Classification Search .................. 372/21, 372/22
See application file for complete search history.

(56) References Cited

U.S. PATENT DOCUMENTS

| | | | |
|---|---|---|---|
| 3,328,518 A * | 6/1967 | Valensi ........................ 348/752 |
| 5,422,903 A | 6/1995 | Yamada et al. | |
| 6,304,366 B1 * | 10/2001 | Scalora et al. .............. 359/328 |
| 6,650,672 B2 | 11/2003 | Kito et al. | |
| 2006/0083477 A1 * | 4/2006 | Takagi et al. ................ 385/147 |
| 2006/0245464 A1 | 11/2006 | Hori et al. | |

FOREIGN PATENT DOCUMENTS

| JP | 7-030181 | 1/1995 |
|---|---|---|
| JP | 2001-257425 | 9/2001 |
| JP | 2004-004419 | 1/2004 |

OTHER PUBLICATIONS

Ho, K.M., et al., "Photonic Band Gaps in Three Dimensions: New Layer-By-Layer Periodic Structures", Solid State Communications, vol. 89, No. 5, pp. 413-416, 1994.

Noda, Susumu, et al., "Alignment and Stacking of Semiconductor Photonic Bandgaps by Water-Fusion", Journal of Lightwave Technology, vol. 17, No. 11, pp. 1948-1955, Nov. 1999.

* cited by examiner

*Primary Examiner*—Minsun Harvey
*Assistant Examiner*—Kinam Park
(74) *Attorney, Agent, or Firm*—Fitzpatrick, Cella, Harper & Scinto (57) ABSTRACT

To provide a light-emitting device having a resonator capable of stably and efficiently taking out light.

The device includes an active medium, a resonator for confining the light having a first wavelength emitted from the active medium within a three-dimensional space and a wavelength conversion medium for converting the wavelength of the light having the first wavelength into a second wavelength.

7 Claims, 6 Drawing Sheets

LIGHT-EMITTING DEVICE HAVING RESONATOR AND LIGHT SOURCE UNIT INCLUDING THE LIGHT-EMITTING DEVICE

BACKGROUND OF THE INVENTION

1. Field of the Invention

The present invention relates to a light-emitting device having a three-dimensional confinement resonator and a light source unit including the light-emitting device. More particularly, the invention relates to a light-emitting device having a three-dimensional confinement resonator which can be applied to light sources for a display device, an optical communication apparatus and an optical-disk.

2. Background Art

Photonic crystal is crystal obtained by artificially applying a refractive-index modulation structure to a substance at a period on the order of light wavelength and is able to control propagation of light in the crystal. A large number of phenomena have been reported so far with respect to such crystals. For example, a typical phenomenon shows that it is possible to prevent light having a certain frequency from propagating through a crystal by means of a photonic band gap (hereafter referred to as PBG).

There are many applied techniques for photonic crystal. Among them, confining light in a microspace by using the property of PBG to apply it to a new device has been energetically studied in recent years.

The photonic crystal can be divided into two dimensions and three dimensions depending on the difference of the property of PGB. Particularly, in the case of a three-dimensional photonic crystal, PBG is present in all orientations of space (complete PBG). Therefore, forming a microdefect in crystal makes it possible to completely confine light in the defect. Therefore, by using the defect as a resonator to provide a completely-confining resonator, it is expected that resonator loss can be greatly decreased and a laser device having a very low threshold can be realized.

DESCRIPTION OF THE RELATED ART

As a conventional example of the completely-confining resonator, Japanese Patent Application Laid-Open No. 2001-257425 (Patent Document 1) discloses a semiconductor laser device serving as a laser which is realized by introducing an active layer into a three-dimensional photonic crystal defect cavity resonator, laser-oscillating the light emitted from the active layer by the resonator and taking out the confined light from a waveguide adjacent to it, and its fabrication method.

Moreover, Japanese Patent Application Laid-Open No. 2004-4419 (Patent Document 2) discloses a method of taking out light while minimizing the influence of light on a resonant state by optimizing positions of a three-dimensional photonic crystal defect cavity resonator and a line defective waveguide when placing the waveguide nearby the resonator.

Furthermore, many wavelength conversion lasers which introduce a nonlinear medium into a resonator to increase the interaction between a laser beam and the nonlinear medium, improving the light conversion rate, are studied and practically used. They can be mainly divided into two types of devices from the viewpoint of device configuration. One of them is a laser in which a nonlinear medium is in the same resonator as a laser active medium and the other of them is a laser in which a nonlinear medium and a laser active layer are in different resonators. The former includes a laser device for outputting second harmonic (SHG) light relative to the fundamental wave of a slid-state laser beam. The latter includes a light parametric oscillator (OPO) and the like for causing a laser beam having a certain wavelength to enter a resonator containing a nonlinear medium as pumping light to convert the beam into lights having different wavelengths (signal light and idler light).

In Japanese Patent Application Laid-Open No. H07-30181 (Patent Document 3), an example is shown in which laser oscillation and wavelength conversion (in this case, SHG) are simultaneously performed in a microresonator of a vertical-resonator-type surface emission laser. In this case, an active layer and a wavelength conversion layer are formed by III-V-group compound semiconductor by using a large linearity of the III-V-group compound semiconductor. Moreover, because the nonlinearity of the III-V-group semiconductor depends on the crystal orientation, the nonlinearity of a medium is increased by using a tilted substrate to grow crystal.

SUMMARY OF THE INVENTION

However, in the case of the conventional example according to the completely confining resonator in the above Patent Document 1 or 2, a problem arises that taking out light becomes more difficult as confining of light is more complete. Unless light can be taken out, a laser using the completely confining resonator does not function as a laser device. Therefore, how to take out light is an important challenge.

As shown in the conventional example in the above Patent Document 1 or 2, the method disclosed so far is a method for taking out light to the outside by fabricating a waveguide nearby an active layer and passing the light through the waveguide. However, in such a method, light leaks from a resonator to the waveguide if the position of the waveguide is slightly deviated from an optimum position and the performance of the resonator is extremely deteriorated.

In the case of the conventional example by the SHG generation device of the vertical-resonator surface emission-type laser described in the above Patent Document 3, light is resonated by a mirror having a reflectance of 90% or more to enhance the interaction with a nonlinear medium. According to this, however, there is a problem that confining of light becomes weak compared to the case of a three-dimensional completely-confining resonator because light is confined in only one direction. Therefore, the interaction with the non-linear medium may be reduced and the conversion efficiency may be decreased.

In view of the above problems, it is an object of the present invention to provide a light-emitting device capable of taking out light when using three-dimensional photonic crystal, and a light-source unit having the light-emitting device.

According to an aspect of the present invention, there is provided a light-emitting device comprising:

a resonator comprising a three-dimensional photonic crystal and a wavelength conversion medium; and an active medium, wherein a light of a first wavelength generated from the active medium is converted into a light of a second wavelength by the wavelength conversion medium and then emitted to the outside of the resonator.

The active medium is preferably locally or periodically located in the three-dimensional photonic crystal.

The wavelength conversion medium is preferably constituted of a nonlinear medium. The nonlinear medium is preferably a harmonic generation medium, sum frequency or difference frequency generation medium, or Raman conversion medium. The nonlinear medium is preferably constituted of III-V-group or II-VI-group semiconductor.

According to still another aspect of the present invention, there is provided a light-source unit comprising:

the light-emitting device according to claim 1; and an elliptic mirror or parabolic mirror at the outside of the resonator, wherein the light converted in its wavelength by the wavelength conversion medium and taken out to the outside of the resonator is condensed by the elliptic or parabolic mirror.

According to a still another aspect of the present invention, there is provided a light-emitting device comprising:

a light-emitting area for generating $\lambda 1$ light;

a resonator including photonic crystal having a photonic band gap; and a wavelength conversion medium for converting the $\lambda 1$ light into $\lambda 2$ light, wherein the $\lambda 1$ light is present in the photonic band gap and the $\lambda 2$ light is emitted to the outside of the photonic crystal.

According to a further aspect of the present invention, there is provided a light-emitting device comprising:

a resonator comprising a three-dimensional photonic crystal, a wavelength conversion medium, a first active medium generating a light of a first wavelength, and a second active medium generating a light of a second wavelength different from the first wavelength, wherein the light of the first wavelength and the light of the second wavelength are converted into a light of a third single wavelength by the wavelength conversion medium and then emitted to the outside of the resonator.

The present invention provides a light-emitting device having a three-dimensional confining resonator constituted as described below and a light source unit having the light-emitting device.

That is, a light-emitting device of the present invention is a light-emitting device having a three-dimensional confining resonator for confining a fundamental wave having a specific wavelength emitted from an active medium in a three dimensional space. The three-dimensional confining resonator includes an active medium for emitting the fundamental wave and a wavelength conversion medium, completely confines the fundamental wave emitted from the active medium in the resonator without leaking the fundamental wave to the outside of the resonator while resonance-amplifying the fundamental wave in the resonator and takes out only the light converted in its wavelength by the wavelength-conversion medium. In the present invention, when using three-dimensional photonic crystal for the base material constituting the resonator, it is possible to realize a configuration for the three-dimensional photonic crystal to have PBG for the light converted in its wavelength by the wavelength conversion medium so as to take out the light confined in the three-dimensional photonic crystal to the outside through a waveguide.

Moreover, a light-source unit of the present invention includes a light-emitting device having the above three-dimensional confining resonator, and an elliptic mirror or parabolic mirror at the outside of the resonator so as to condense the light converted in its wavelength by the wavelength conversion medium and taken out to the outside of the resonator by the elliptic mirror.

According to the present invention, a light-emitting device having three-dimensional photonic crystal and a light source unit having the light-emitting device may be realized.

BRIEF DESCRIPTION OF THE SEVERAL VIEWS OF DRAWINGS

FIGS. 1A, 1B and 1C are schematic views showing a configuration of a laser resonator in the embodiment 1 of the present invention, in which

FIGS. 5A, 5B and 5C are schematic views showing a configuration of a laser resonator in the embodiment 2 of the present invention, in which

DETAILED DESCRIPTION OF THE INVENTION

According to the present invention, by using the above configuration, it is possible to achieve the object of the present invention. However, a light-emitting device having a three-dimensional confining resonator of each of embodiments of the present invention may specifically include means (active medium) for generating a fundamental wave having a specific wavelength by injecting current, means (three-dimensional confining resonator) for confining the fundamental wave in a three-dimensional space and amplifying the fundamental wave, and means (wavelength conversion medium) for converting the fundamental wave in its wavelength into a converted wave having another wavelength. Also, the device may be arranged to take out the converted wave light to the outside of the resonator by converting the wavelength of the amplified fundamental wave into the converted wave having another wavelength. In this case, the fundamental wave having a certain specific wavelength represents not only light of a single wavelength having a very narrow oscillation spectrum of a continuously oscillating laser beam but also the light having a slightly wide width having an oscillation spectrum width of 10 nm or more such as pulse oscillation laser beam.

According to the configuration of this embodiment, an active medium and wavelength conversion medium are included in a three-dimensional confining resonator, a fundamental wave output from the active medium is completely confined without leaking it to the outside while resonance-amplifying the fundamental wave in the resonator and it is possible to stably and efficiently take out only the light wavelength-converted by the wavelength conversion medium. Moreover, it is unnecessary to form a microwaveguide in the resonator and unnecessary to very precise position control of the waveguide. Therefore, it is possible to avoid deterioration of the function of a device due to a fabrication error. Furthermore, because light is three-dimensionally confined in the resonator, loss of the light is small and it is possible to increase the light density in the resonator. Thereby, the interaction between the light and the wavelength conversion medium increases and it is possible to realize a high conversion efficiency. Therefore, it is possible to provide a laser having a high performance as a wavelength conversion laser.

As described above, in the case of takeout of light in this embodiment, though the three-dimensional confining resonator and the active medium and wavelength conversion medium in the resonator are important components, the three-dimensional confining resonator is first described below.

The three-dimensional confining resonator requires a resonator capable of completely confining a fundamental wave before wavelength-converted without leaking it to the outside of the resonator and transmitting only a converted wave.

Any resonator can be used as long as it has the above property. However, because a defect cavity resonator using three-dimensional photonic crystal has complete PBG and is able to control the wavelength area of light passing through crystal depending on design, the resonator is suitable for this purpose. In this case, it is preferable that a member constituting the photonic crystal does not greatly absorb fundamental waves or converted waves.

As a member constituting the photonic crystal, it is possible to use semiconductors such as GaAs or GaN, dielectric material such as $TiO_2$ or $SiO_2$, metal such as W or Au and resin such as PMMA (polymethyl methacrylate) or acrylic resin. However, to realize current injection, it is preferable to use a conductive metal or semiconductor material.

Then, as a member used for an active layer, it is possible to use semiconductors such as InGaAsP or InGaN, organic pigment such as $Alq_3$ or Rhodamine 6G or solid laser medium such as Nd:YAG or Ti:Sapphire. To emit light by current injection similarly to the case of a member constituting photonic crystal, it is preferable that a member used for an active layer is a semiconductor material. In the case of this embodiment, a configuration is used in which the above active layer is locally or periodically set in a three-dimensional confining resonator.

Then, as a wavelength conversion method, it is possible to mainly use a wavelength conversion method using a nonlinear optical effect. Specifically, there are the harmonic generation method, sum frequency and difference frequency method, stimulated Raman scattering method and stimulated brillouin scattering method.

Moreover, as wavelength conversion media, various nonlinear media have been reported so far. As harmonic generation medium and sum frequency and difference frequency medium, there are oxide dielectric crystals such as $\beta\text{-}BaB_2O_4$ (BBO), $LiNbO_3$(LN), $LiTaO_3$ and $KTiPO_4$(KTP) and crystal obtained by doping one of these substances with an element such as Mg and chalcopyrite semiconductor crystal such as $AgGaS_2$.

Furthermore, there is a method for performing wavelength conversion by an active layer or semiconductor layer adjacent to the active layer by using the large nonlinearity of III-V-group or II-VI-group semiconductor medium. In this case, to improve effective nonlinearity, a substrate having a high exponent face is used. In respect of the property of the nonlinear medium, it is preferable that a nonlinear optical constant is large and fundamental waves or converted waves are not greatly absorbed.

Furthermore, when performing wavelength conversion by using the nonlinearity of the semiconductor medium which can be a laser medium, it is possible to use the same type of semiconductor for an active layer and an adjacent semiconductor layer. Therefore, it is possible to set an active layer and a wavelength conversion medium in the same crystal prepared through crystal growth in a lump. Thereby, advantages are obtained that a reflection loss due to an interface can be lower and a fabrication process can be more simplified than when the active layer and the nonlinear medium are separated.

To perform wavelength conversion by using the nonlinear medium, it is important to realize phase matching between a fundamental wave and a converted wave. To realize the phase matching, various methods are already reported and become publicly-known techniques. As methods which can be used for the present invention, there are an angle matching method using the double refraction of crystal and quasi phase matching method in which the nonlinear polarization of crystal is periodically reversed. Moreover, when using stimulated Raman scattering (Raman conversion using the stimulated Raman scattering), it is possible to use para-hydrogen as a Raman medium. This embodiment uses a configuration of locally or periodically setting the wavelength conversion medium in a three-dimensional confining resonator.

By using the above system and thereby wavelength-converting a fundamental wave light-emitted by an active medium in a three-dimensional confining resonator by a wavelength conversion medium in the resonator and taking out only the fundamental wave to the outside of the resonator, it is possible to take out a converted wave to the outside of the resonator without leaking the resonated fundamental wave.

Moreover, it is possible to freely change the size of a defect when a resonant condition is satisfied and many laser oscillations in which light is confined in a defect in photonic crystal are reported. Therefore, using photonic crystal can contribute to downsizing of a device.

As described above, a resonator does not require a light-takeout waveguide for light takeout of the present invention. However, to control a light takeout direction and takeout quantity, it is possible to form a waveguide in the resonator according to necessity. In this case, it is necessary to design a resonator and a waveguide so that a converted wave is confined in the resonator and only the light propagating through the waveguide can be taken out to the outside of the resonator. In this case, when using three-dimensional photonic crystal for the base material of the resonator, this can be realized by designing photonic crystal so as to have complete PBG for a converted wave and forming a defective waveguide.

When taking out the converted wave without using the waveguide (that is, when photonic crystal becomes transparent for the converted wave; refer to description in FIG. 3 to be described later), light is emitted in a direction corresponding to a light mode pattern in the resonator. Therefore, to control taken-out light, it is necessary to control a radiation direction by external units such as a mirror and a lens (refer to description in FIG. 4 to be described later).

Figure 1A:
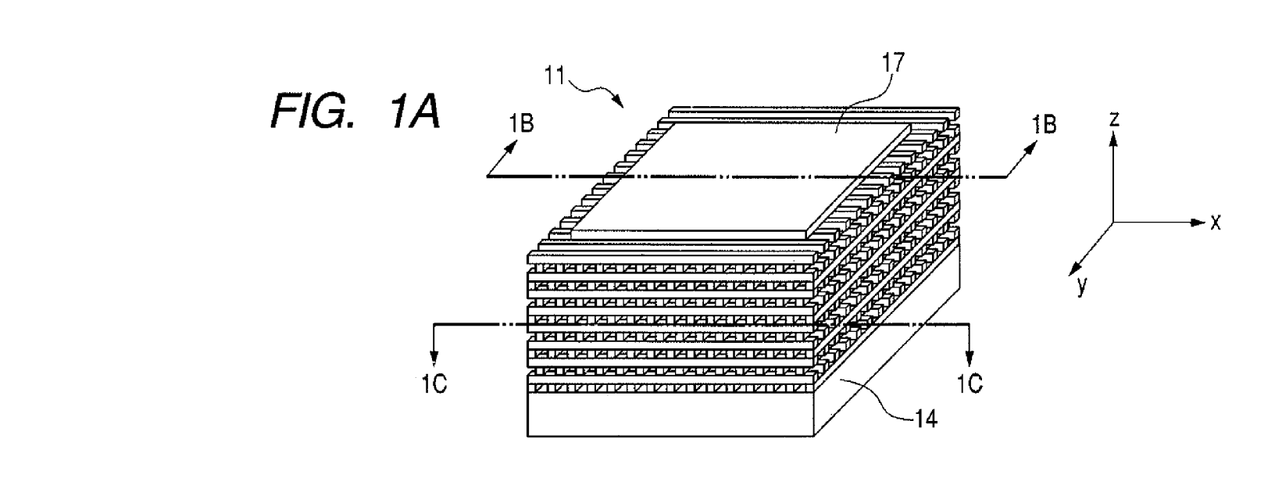
FIG. 1A is a perspective view of the whole laser resonator.
Figure 1B:
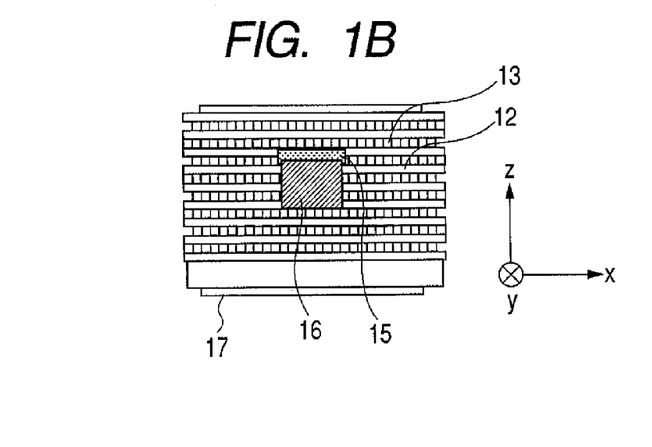
FIG. 1B is a sectional view parallel with the plane zx at the line 1B-1B of the laser resonator shown in FIG. 1A
Figure 1C:
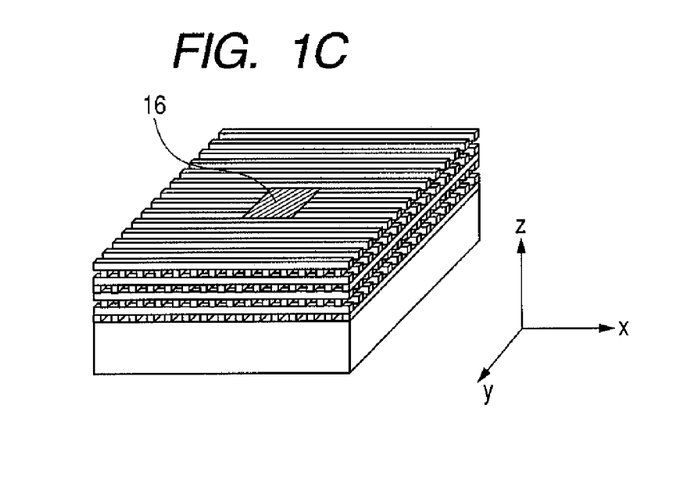
FIG. 1C is a perspective view including a sectional view of a plane parallel with the plane xy at the line 1C-1C of the laser resonator shown in FIG. 1A.

FIGS. 1A to 1C show an example in which an active medium is completely surrounded by photonic crystal. However, it is also possible to use the configuration shown in FIG. 9. Reference numeral 901 denotes an area including a gain medium and a wavelength conversion medium to generate the light having a wavelength of λ1 by current injection (whose electrode is not shown) or the like. Reference numeral 902 denotes photonic crystal functioning as a mirror for the light of λ1. That is, the light having the wavelength of λ1 is located in the photonic band gap of the photonic crystal 902 and as a result, light confinement occurs in the vertical direction of 901. Moreover, reference numeral 950 denotes a mirror area functioning as a reflection layer for wavelengths λ1 and λ2 (to be described later). It is allowed to use photonic crystal and it is allowed to constitute the mirror area by a single layer film or a multilayer film. That is, the present invention is not restricted to a case in which a gain medium is completely surrounded by photonic crystal.

Figure 9:
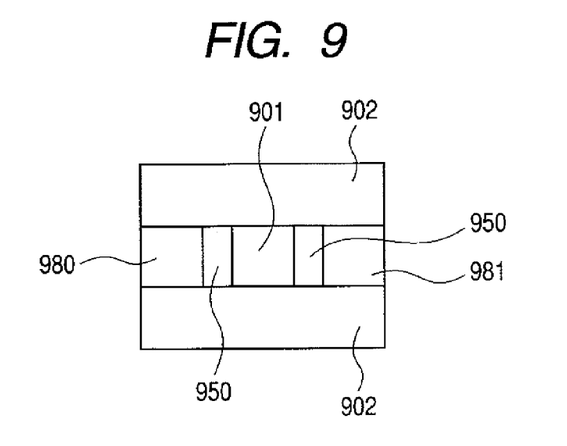
FIG. 9 is a schematic view showing another configuration of a laser resonator of the present invention.

Reference numerals 980 and 981 denote a filler used according to necessity.

The light generated at the wavelength of λ1 at 901 is amplified resonating in the cavity comprising the right and left mirrors 950 and upper and lower photonic crystals 902 and when the light reaches a predetermined optical intensity, it is converted into the wavelength λ2 by the wavelength conversion medium (not shown).

The right and left mirrors function as mirrors for the wavelength λ2. The light converted into λ2 is designed so as to be able to transmit through the photonic crystal 902. Thus, it is possible to provide a light-emitting device having a directivity in the direction of emitted light.

All of the Figures are schematic drawings. Contents of the drawings such as size and frequency number of photonic crystal regarding devices are therefore not necessarily drawn to their real substances in the figures.

EMBODIMENTS

The embodiment 1 constitutes a laser resonator by applying the present invention.

Embodiment 1

The embodiment 1 constitutes a laser resonator applying the present invention.

FIGS. 1A to 1C show schematic views of the laser resonator of this embodiment.

FIG. 1A is a perspective view of the whole laser resonator, FIG. 1B is a sectional view of a plane parallel with the plane xz at the line 1B-1B of the laser resonator shown in FIG. 1A and FIG. 1C is a perspective view including a sectional view of a plane parallel with the plane xy at the line 1C-1C of the laser resonator shown in FIG. 1A.

In FIG. 1A, reference numeral 11 denotes a laser resonator using three-dimensional photonic crystal as a component member, which is constituted of three-dimensional photonic crystal having complete PBG. This embodiment uses a Woodpile structure (Solid State Communications Vol. 89, p. 413) which is known as three-dimensional photonic crystal.

Reference numeral 12 denotes a photonic-crystal resonator component member which is constituted of a semiconductor having a large refractive index and 13 denotes a gap hollow structure. The whole resonator is set on a substrate 14.

Moreover, reference numeral 15 denotes an active medium and 16 denotes a wavelength conversion medium. The active medium 15 having a multiple quantum well structure and the wavelength conversion medium 16 adjacent to the active medium 15 are embedded at the central portion of the photonic crystal.

The periodicity of the photonic crystal is broken at the position of the wavelength conversion medium 16 to function as a defect. Therefore, as described above, the light having a frequency in the PBG is completely confined in the defect portion, the defect portion serves as a resonator which is able to amplify the light emitted from the active medium. Moreover, current injection is performed through electrodes 17 at the upper and lower portions of a device.

In the case of this embodiment, the photonic crystal uses GaN as the material of a laser resonator and above and below the active medium p-type and n-type GaN is used respectively, the light-emitting medium uses the multiple quantum well structure of InGaAsP and the wavelength conversion medium uses nonlinear crystal of BBO.

A rod constituting the photonic crystal is a rectangle in which the cross section has a width of 130 nm and the z-directional length is 160 nm, the period of the photonic crystal is 640 nm and a photonic crystal structure having four periods is set in ±z directions though it is not clearly shown. The size of the xy plane area of the resonator is approximately 10 μm and the defect portion is a cube whose one side is 900 nm.

In this case, when injecting current from the electrodes 17, carriers are injected into the active medium 15, light is emitted and the emitted light is amplified by a defect cavity resonator to perform laser oscillation.

The oscillated laser beam (fundamental wave) is wavelength-converted by a nonlinear medium constituting the wavelength conversion medium 16. This embodiment uses a second harmonic generation (SHG) which is a secondary nonlinear optical effect. In this case, to improve a wavelength conversion efficiency, a position to which a nonlinear medium is introduced and phase matching conditions between a fundamental wave and converted wave become important.

First, a position to which the nonlinear medium which is a wavelength conversion medium is introduced is described.

In the case of this embodiment, resonation occurs in three direction of x, y and z in accordance with conditions of the shape and size of a resonator. An area in which an optical density is large and an area in which the optical density is small are produced in resonant directions in the resonator because the directions are respectively kept in a standing wave state. To improve the wavelength conversion efficiency, it is at least necessary that a nonlinear medium is introduced into an area of them having a larger optical density.

Now, a phase matching condition is described. It is known that nonlinear optical crystal showing a double refraction property such as BBO can satisfy a phase matching condition by tilting an optical axis from the resonant direction of light by a certain angle. When considering one resonant direction for simplification, a phase matching condition of a medium free from double refraction is shown below.

(Numerical Formula 1)

$\omega_2 n_2 = 2\omega_1 n_1$. $\omega_1$ and $\omega_2$ are frequencies of a fundamental wave respectively and a double wave and $n_1$ and $n_2$ are refractive indexes of $\omega_1$ and $\omega_2$ respectively.

Though the above conditions are not satisfied by crystal having no double refraction property, they can be satisfied by using normal optical component and abnormal optical component in the case of double refraction crystal.

How to set nonlinear optical crystal of BBO for the resonant direction of a fundamental wave is described below.

Figure 2:
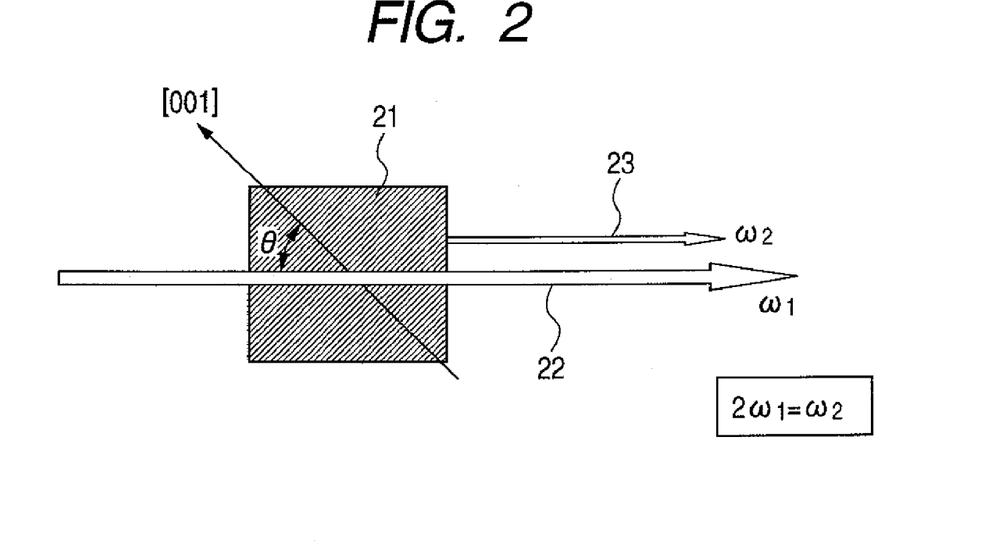
FIG. 2 is an illustration showing schematic crystal arrangement for second harmonic generation by the nonlinear medium of BBO in the embodiment 1 of the present invention.

FIG. 2 shows a schematic crystal arrangement for generating a second harmonic by the nonlinear medium of BBO. In FIG. 2, reference numeral 21 denotes nonlinear optical crystal of BBO, 22 denotes a ray incoming to crystal (fundamental wave $\omega_1$) and 23 denotes a double wave ($\omega_2$). The above expression is satisfied by tilting the [001] axis which is the optical axis of crystal from the incoming ray by a predetermined angle.

In this case, the following relation is effected.

(Numerical Formula 2)

$\omega_2 n_{2e} = 2\omega_1 n_{1o}$. $\omega_1$ and $\omega_2$ are frequencies of a fundamental wave and double wave, $n_{1o}$ is the refractive index of a normal optical component in $\omega_1$, $n_{2e}$ is the refractive index of an extraordinary optical component in $\omega_2$. Thus, by using double-refractive nonlinear crystal, the phase matching condition is satisfied and it is possible to improve the conversion efficiency. In the case of BBO, $\theta$ is equal to 48°.

By introducing the nonlinear medium at a crystal angle for satisfying the phase matching condition into a place having a large optical density in accordance with a spatial distribution in the resonant mode, it is possible to realize a high conversion efficiency.

Moreover, because there are a plurality of resonant directions in the case of this embodiment, it is preferable to arrange a plurality of nonlinear crystals respectively having a crystal angle of 48° in each resonant direction.

It is possible to fabricate the laser resonator of this embodiment by using the following process. First, the photonic crystal having a woodpile structure is fabricated by using the publicly-known stacking technique shown in JOURNAL OF LIGHTWAVE TECHNONOGY, VOL. 17, p. 1948. According to this method, it is possible to fabricate a three-dimensional photonic crystal structure including a hollow defect structure through preferable control. Moreover, a nonlinear medium is introduced into the hollow defect structure and fixed in the hollow defect structure in accordance with the thermal-fusion bonding method. A portion of the nonlinear medium entering the hollow defect structure is worked by using dry etching and a portion not entering a glued resonator is removed through polishing. The surface is smoothed in accordance with the CMP (Chemical Mechanical Polishing) method or the like, and then photonic crystal layers are laminated to extend the hollow defect structure. Thereafter, a laser active medium is similarly introduced by the thermal-fusion bonding method. The laser active medium is previously epitaxial-grown on other wafer to work it to the size of the hollow defect structure by using dry etching. Thereafter, the laser active medium is fusion-bonded in a defect together with the wafer to remove an upper substrate through wet etching. To remove the upper substrate, an etching stop layer is previously introduced into the lower portion of the active layer of the wafer. After the surface is smoothed in accordance with the CMP method, a photonic crystal is prepared so as to cover the hollow defect structure and a resonator is completed. Finally, an electrode is vacuum-deposited.

Finally, takeout of light is described.

Figure 3:
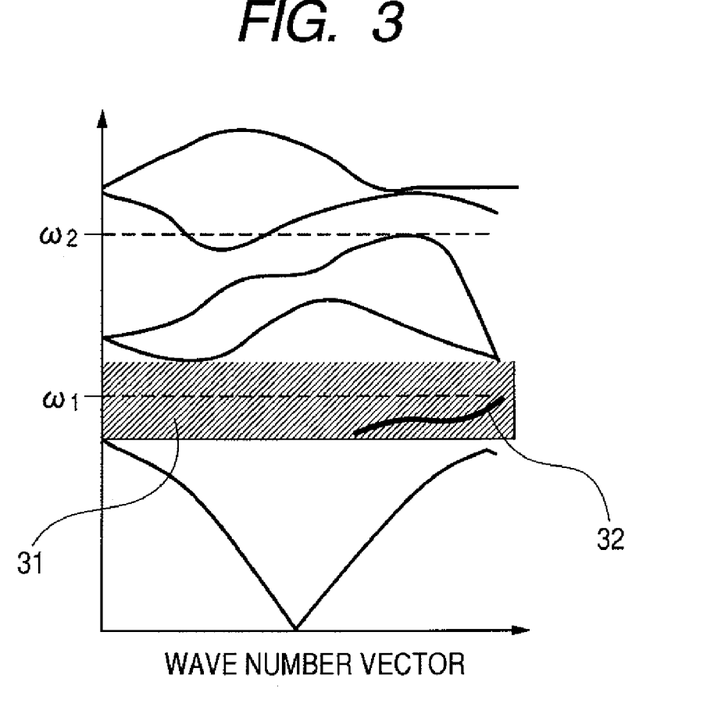
FIG. 3 is an illustration schematically showing a dispersion relation between frequency (photonic band gap structure) and wave number of light propagating through photonic crystal in the embodiment 1 of the present invention.

FIG. 3 is a schematic diagram (photonic band diagram) showing the dispersion relation between the frequency of the light propagating through the photonic crystal constituting the laser resonator 11 and the wave number. The hatched portion 31 in FIG. 3 shows that a dispersion curve other than a defective mode is not present or the light in the frequency band cannot be present on a portion other than the defect of photonic crystal and the light in PBG is confined in the defect. A thick line 32 denotes the defective mode of a resonator and $\omega_1$ and $\omega_2$ denote frequencies of a fundamental wave and a converted wave respectively.

As shown in FIG. 3, because a fundamental wave has a frequency in PBG, it is only present in crystal as a defective mode but it does not leak to the outside. Therefore, it is possible to oscillate the fundamental wave in a resonator which has an active medium and in which complete confinement is established. However, for a converted wave, it is found that a dispersion curve is present at the position of the frequency of the converted wave but PBG is not present. In this case, because photonic crystal is transparent for the converted wave and it is possible to freely take out light to the outside. According to the above principle, it is possible to take out the converted wave without weakening confinement of the fundamental wave used for laser oscillation in the case of this embodiment.

Figure 4:
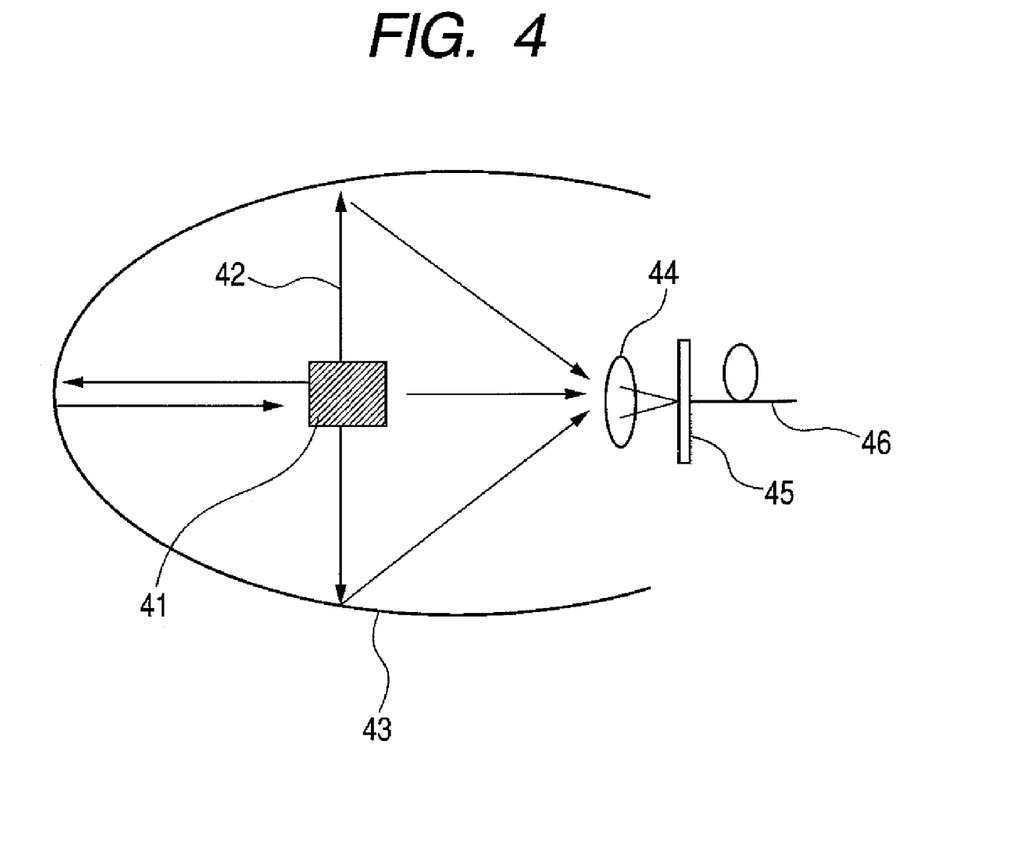
FIG. 4 is an illustration showing an example of emission of light by an external unit to which the embodiment 1 of the present invention is applied.

FIG. 4 shows an example of radiation control of light by an external unit to which this embodiment is applied.

In FIG. 4, reference numeral 41 denotes a laser device constituted of this embodiment, 42 denotes a laser beam emitted from the laser device, 43 denotes an elliptic mirror, 44 denotes a condensing lens, 45 denotes an optical fiber support tool and 46 denotes an optical fiber.

In the case of the laser device of this embodiment, a laser beam is radiated in three directions of x, y and z of a space by reflecting a resonator structure. In this case, light can be efficiently used by using the elliptic mirror shown in FIG. 4 and thereby, condensing light to one point and connecting the light to an optical fiber and the convenience is improved when using the light.

In addition to the above configuration, it is also allowed to control the radiation of light by using a waveguide and thereby designing photonic crystal so as to also have PBG for a converted wave as described above.

Moreover, in the case of this embodiment, three-dimensional photonic crystal illustratively uses a woodpile structure. However, any other structure can be used as long as it has a photonic crystal structure capable of embedding an active medium and a wavelength conversion medium in a resonator. As a structure which can be used for other purposes, many structures can be considered such as a structure having been publicly known so far, such as opal and inverse opal structure and spiral structure.

Moreover, though a light-emitting medium is InGaAsP, it is allowed to use III-V-group substance such as InGaAs, AlGaInP, AlGaAs, AlGaAsSb, GaN, InGaN, AlGaN or GaInNAs or II-VI-group substance such as ZnSe, ZnCdS or ZnSSe.

This embodiment uses SHG conversion by nonlinear crystal BBO for the wavelength conversion medium. For generation of harmonic, however, it is also possible to use third or fourth harmonic. Moreover, it is possible to use the above described harmonic, sum-frequency and difference-frequency generation media as nonlinear media. Furthermore, it is possible to use Raman conversion according to the stimulated Raman scattering phenomenon by using a Raman conversion medium. Furthermore, by forming a wavelength conversion portion with the same type of semiconductor materials with the active medium (the composition of each element is not necessarily same) by III-V-group or II-VI-group semiconductor, it is also possible to use the wavelength conversion technique using a large nonlinearity of the compound semiconductor as described above.

Embodiment 2

The embodiment 1 is a laser resonator constituted by applying the present invention.

Figure 5A:
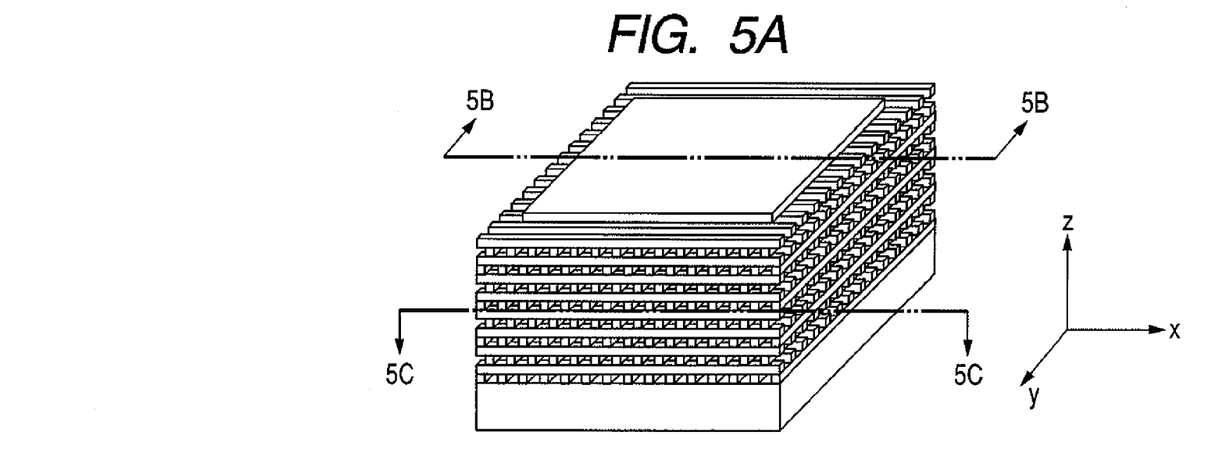
FIG. 5A is a perspective view of the whole laser resonator.
Figure 5B:
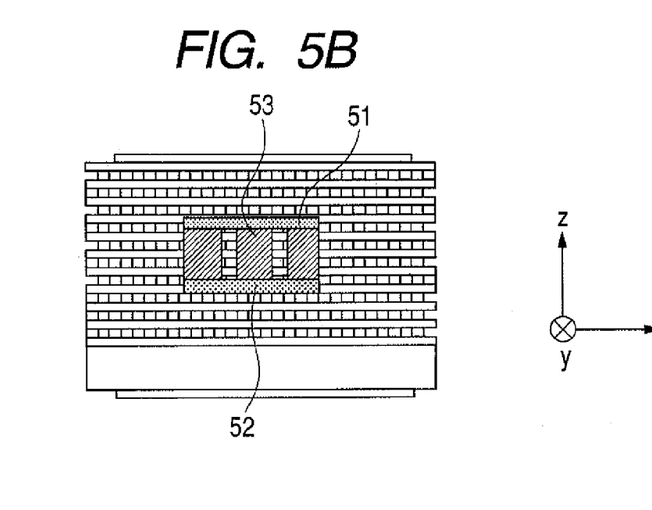
FIG. 5B is a sectional view of the laser resonator shown in FIG. 5A parallel with the plane zx of the line 5B-5B and FIG. 5C is a perspective view including a sectional view of a plane parallel with the plane xy at the line 5C-5C of the laser resonator showing in FIG. 5A.
Figure 5C:
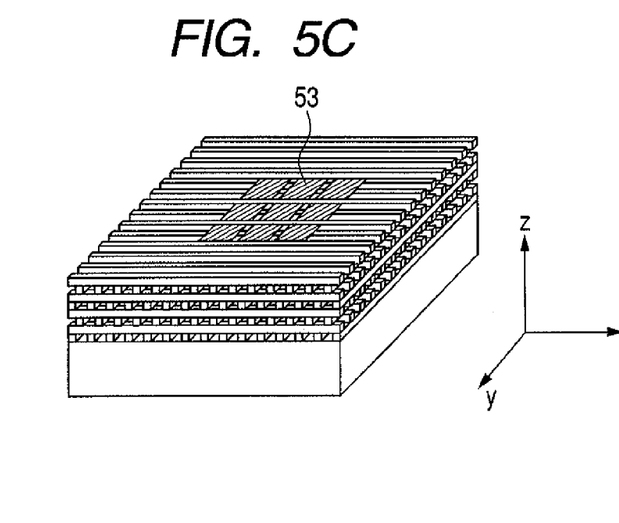

FIGS. 5A to 5C show schematic views of a laser resonator of embodiment 2.

The relation between FIGS. 5A, 5B and 5C is the same as the relation between FIG. 1A, FIG. 1B and FIG. 1C of the embodiment 1.

In the case of this embodiment, active layers 51 and 52 having two types of light-emitting wavelengths different from each other are set to the both ends of the resonator. Moreover, wavelength conversion media 53 are periodically arranged by keeping a certain interval from each other and respectively have a structure which does not interrupt injected current. The size of the whole device and the material of the photonic crystal serving as a resonator are the same as the case of the embodiment 1. Moreover, it is possible to apply the same method as the case of the embodiment 1 to the fabrication method.

In the case of this embodiment, two active layers are constituted of multiple quantum well structures of InGaAsP having compositions different from each other. Moreover, $AgGaS_2$(AGS) is used for the nonlinear optical medium constituting each wavelength conversion medium 53. A rod constituting photonic crystal is a rectangle whose cross section has a width of 160 nm and a z-directional thickness of 200 nm, the period of the photonic crystal is 800 nm, the size of a defective portion in Z-axis direction is 1,600 nm, the cross section of the wavelength conversion medium is a square whose one side is 600 nm and the interval between the wavelength conversion media is 200 nm. Three lines of wavelength conversion media are respectively arranged in X-axis and Y-axis directions. When injecting current from an electrode, lights having different wavelengths are emitted from the both active layers 51 and 52. Because the resonator is designed so as to have PBG for the both lights, the lights are confined in the resonator, amplified and oscillated. In this case, the nonlinear medium is angle-adjusted and set so as to be phase-matched by the lights emitted from the active layers 51 and 52 and in the condition of three-wave mixture by the converted lights. In the case of this embodiment, the lights emitted from the active layers 51 and 52 are near infrared lights having wavelengths of 1,320 nm and 1,450 nm. By using the difference frequency between the lights of these two wavelengths, it is possible to obtain mid infrared light having a wavelength of approximately 8.75 μm.

Figure 6:
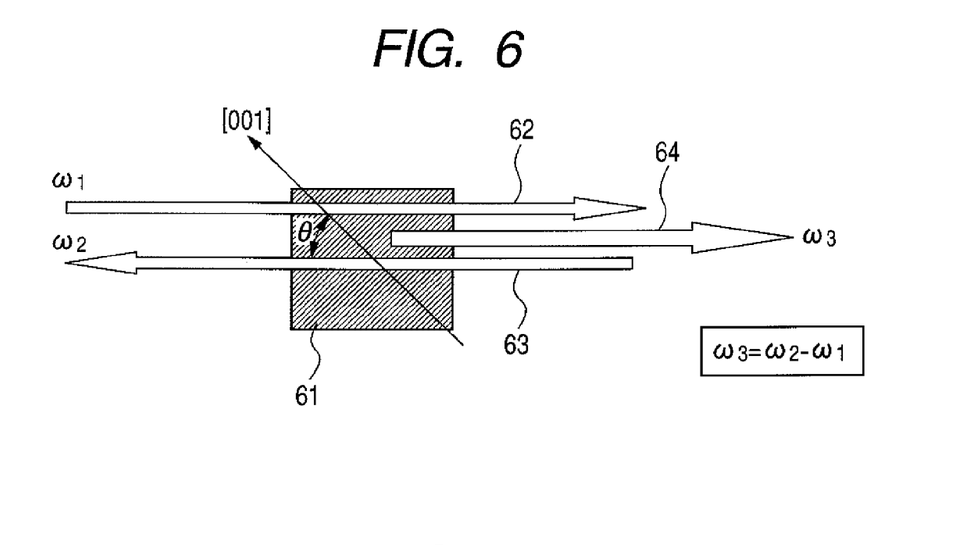
FIG. 6 is an illustration showing a state in which a difference frequency by mixture of three waves is generated by nonlinear optical crystal AGS in the embodiment 2 of the present invention.

FIG. 6 shows a state of generation of a difference frequency by three-wave mixture using nonlinear optical crystal. In FIG. 6, reference numeral 61 denotes nonlinear optical crystal AGS, 62 and 63 denote laser beams emitted from two different active layers and 64 denotes a difference frequency light converted by AGS.

The following is a phase matching condition in generation of a difference frequency.

(Numerical Formula 3)

$\omega_2 n_{3e} = \omega_1 n_{1o} - \omega_2 n_{2o}$. Also in this case, by tilting the [001] axis of crystal from the resonant direction of light by a predetermined angle similarly to the case of embodiment 1, it is possible to satisfy the phase matching condition. The phase matching angle θ of this embodiment becomes 36°.

Figure 7:
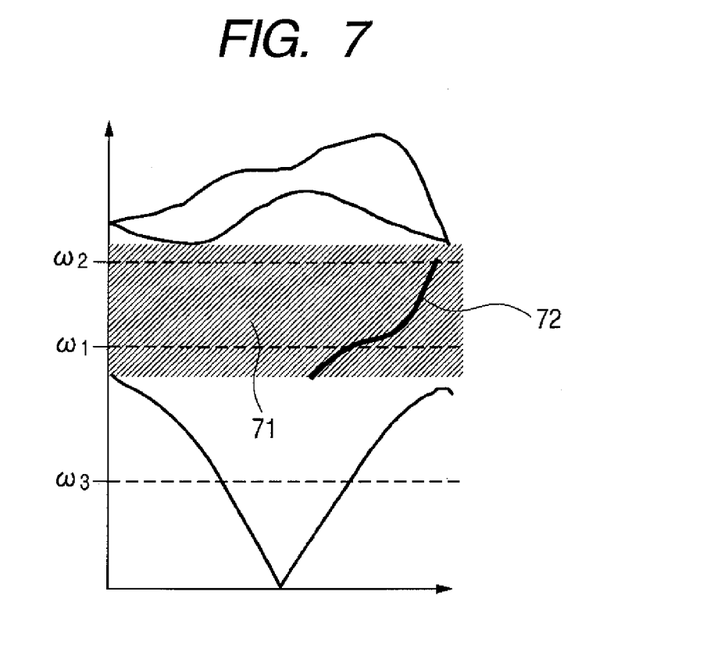
FIG. 7 is an illustration schematically showing a photonic band structure of photonic crystal in the embodiment 2 of the present invention.

FIG. 7 schematically shows the band structure of photonic crystal of this embodiment. In FIG. 7, the hatched portion of 71 shows PBG and the thick line of 72 shows a defective mode.

$\omega_1$ and $\omega_2$ are angular frequencies emitted from two different active layers and $w_3$ is the frequency of converted light due to generation of a difference frequency, which is taken to the outside of the resonator.

As shown in FIG. 7, by having PBG for $\omega 1$ and $\omega 2$ and designing a photonic crystal structure so as to transmit only $\omega 3$, it is possible to take out the converted wave $\omega 3$ without weakening resonant states of $\omega 1$ and $\omega 2$.

In the case of this embodiment, a crystal angle is adjusted so as to satisfy the condition of a difference frequency. However, it is absolutely possible to adjust the crystal angle so as to satisfy the condition of a sum frequency. Therefore, by freely changing the wavelength of the light emitted from an active layer, it is possible to emit the light having a wavelength covering a very wide range. Materials which can be used here, it is possible to apply many materials described for the embodiment 1 to photonic crystal, active layer, and nonlinear medium. Moreover, it is possible to use any structure other than a woodpile structure when photonic crystal is three-dimensional photonic crystal.

Each of all above-described contents is only an example but the present invention is not restricted by these contents.

Embodiment 3

Another embodiment of the present invention is described below. This is an example of providing directivity for emitted light.

Figure 8A:
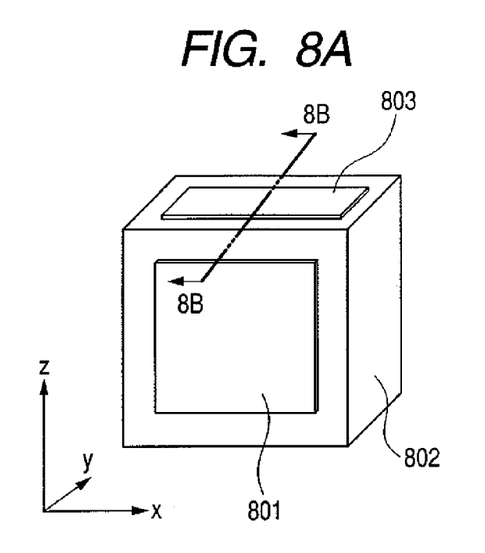
FIGS. 8A and 8B are an illustration for explaining the embodiment 2 of the present invention.
Figure 8B:
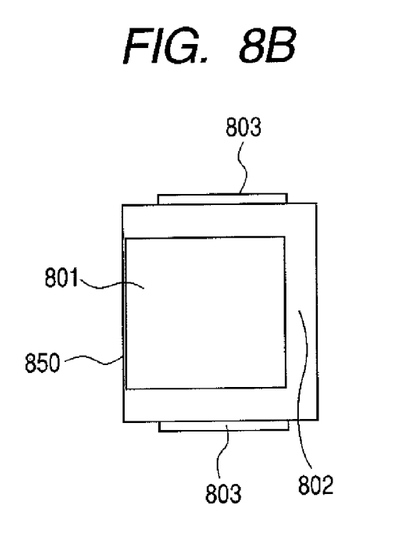

A second configuration of a resonator of the present invention is described by referring to FIGS. 8A and 8B.

FIG. 8A is a perspective view of the resonator having the second configuration, viewed from the diagonally upper portion and FIG. 8B is a sectional view parallel with plane yz at the line 8B-8B of the resonator.

Reference numeral 801 denotes the resonator shown in FIGS. 1A to 1C. Reference numeral 802 denotes photonic crystal whose period and rod sectional area are different from the case of the resonator in FIGS. 1A to 1C. Reference numeral 803 denotes an electrode set to the resonator having this configuration.

In the case of the configuration of this resonator, the resonator 801 has a structure which is surrounded by the photonic crystal 802 whose period and rod sectional area are different from the case of 801.

In the case of the photonic crystal 802, the period and rod sectional area are half of those of the photonic crystal in FIGS. 1A to 1C.

It is preferable to set the length of the photonic crystal 802 to four periods or more similarly to the case of the photonic crystal of the resonator 801.

As shown in FIG. 8, the resonator 801 has a structure in which five faces out of six faces of the resonator faces are covered with photonic crystal and only one remaining face is exposed. A material constituting the photonic crystal 802 is GaN which is the same as the case of the resonator 801.

The photonic crystal 802 functions as a mirror for second harmonic emitted from the resonator 801 because the photonic band gap is a half wavelength of the photonic crystal of the resonator 801.

Therefore, the second harmonic emitted from the resonator 801 is emitted from only a window portion 850 to which the photonic crystal 802 is not set.

A resonator having this configuration is fabricated by using the same process method as individual fabrication process for the resonator 801. However, the resonator is fabricated so that the period and rod sectional area of the photonic crystal 802 are halved compared with the period and rod sectional area of 801.

By using the resonator having this configuration, it is possible to take out only the light in a certain direction among the radiated lights in FIGS. 1A to 1C. That is, it is possible to secure directivity.

Moreover, when the face on which the window portion of the photonic crystal of 02 is set differs, each pattern of radiated light differs because the resonant mode of the light differs. Therefore, it is possible to fix the direction of emitted light by the face on which the window portion is set and control the radiated pattern.

This application claims priority from Japanese Patent Application No. 2004-349663, filed Dec. 2, 2004, which is hereby incorporated by reference herein.

What is claimed is:

1. A light-emitting device comprising:
a resonator comprising a three-dimensional photonic crystal having a defect,
a wavelength conversion medium in the defect, and
an active medium in the defect, together with the wavelength conversion medium,
wherein a first light generated from the active medium is converted into a second light by the wavelength conversion medium, the first light has a frequency which is in a photonic band gap of the photonic crystal, and the second light has a frequency which is not in the photonic band gap of the photonic crystal,
whereby the second light is emitted to the outside of the resonator.

2. The light-emitting device according to claim 1, wherein the active medium is locally or periodically located in the three-dimensional photonic crystal.

3. The light-emitting device according to claim 1, wherein the wavelength conversion medium is constituted of a nonlinear medium.

4. The light-emitting device according to claim 3, wherein the nonlinear medium is a harmonic generation medium, sum frequency or difference frequency generation medium, or Raman conversion medium.

5. The light-emitting device according to claim 4, wherein the nonlinear medium is constituted of III-V-group or II-VI-group semiconductor.

6. A light-source unit comprising:
the light-emitting device according to claim 1; and
an elliptic mirror or parabolic mirror at the outside of the resonator, wherein
the light converted in its wavelength by the wavelength conversion medium and taken out to the outside of the resonator is condensed by the elliptic or parabolic mirror.

7. A light-emitting device comprising:
a resonator comprising a three-dimensional photonic crystal having a defect,
a wavelength conversion medium in the defect,
a first active medium in the defect generating a first light, and
a second active medium in the defect generating a second light having a frequency different from the first light,
wherein the first light and the second light are converted into a third light by the wavelength conversion medium, frequencies of each of the first and second lights are in a photonic band gap of the photonic crystal, and the third light has a frequency which is not in the photonic band gap of the photonic crystal,
whereby the third light is emitted to the outside of the resonator.

* * * * *